United States Patent [19]
Genheimer et al.

[11] Patent Number: 6,043,946
[45] Date of Patent: Mar. 28, 2000

[54] READ ERROR RECOVERY UTILIZING ECC AND READ CHANNEL QUALITY INDICATORS

[75] Inventors: Stephen R. Genheimer, Mustang; Jimmie R. Shaver, Yukon, both of Okla.

[73] Assignee: Seagate Technology, Inc., Scotts Valley, Calif.

[21] Appl. No.: 08/945,265

[22] PCT Filed: Mar. 27, 1997

[86] PCT No.: PCT/US97/04906

§ 371 Date: Oct. 21, 1997

§ 102(e) Date: Oct. 21, 1997

[87] PCT Pub. No.: WO97/43835

PCT Pub. Date: Nov. 20, 1997

Related U.S. Application Data

[60] Provisional application No. 60/017,769, May 15, 1996.

[51] Int. Cl.[7] ....................................................... G11B 5/09
[52] U.S. Cl. .............................................. 360/53; 714/769
[58] Field of Search ........................ 360/46, 53; 371/30, 371/31, 37.7, 37.9, 40.3, 40.14, 43.6, 43.7; 714/769, 707, 746, 758, 765, 794

[56] References Cited

U.S. PATENT DOCUMENTS

| | | |
|---|---|---|
| 4,799,112 | 1/1989 | Bremmer et al. . |
| 4,972,316 | 11/1990 | Dixon et al. . |
| 5,047,876 | 9/1991 | Holsinger . |
| 5,051,998 | 9/1991 | Murai et al. . |
| 5,057,785 | 10/1991 | Chung et al. . |
| 5,142,537 | 8/1992 | Kutner et al. ............................. 371/31 |
| 5,189,566 | 2/1993 | Christensen et al. . |
| 5,220,569 | 6/1993 | Hartness . |
| 5,231,556 | 7/1993 | Blanks . |
| 5,262,907 | 11/1993 | Duffy et al. . |
| 5,276,662 | 1/1994 | Shaver, Jr. et al. . |
| 5,373,400 | 12/1994 | Kovacs . |
| 5,422,760 | 6/1995 | Abbott et al. . |
| 5,430,768 | 7/1995 | Minuhin et al. . |
| 5,459,757 | 10/1995 | Minuhin et al. . |
| 5,502,713 | 3/1996 | Lagerqvist et al. . |
| 5,530,705 | 6/1996 | Malone, Sr. . |
| 5,602,857 | 2/1997 | Zook et al. ............................. 371/40.1 |
| 5,625,506 | 4/1997 | Dovek et al. ............................. 360/53 |
| 5,627,843 | 5/1997 | Deng et al. . |
| 5,687,036 | 11/1997 | Kassab . |
| 5,721,816 | 2/1998 | Kusbel et al. . |
| 5,761,212 | 6/1998 | Foland, Jr. et al. ....................... 360/53 |
| 5,774,285 | 6/1998 | Kassab et al. . |

*Primary Examiner*—W. Chris Kim
*Assistant Examiner*—Regina Y. Neal
*Attorney, Agent, or Firm*—Crowe & Dunlevy

[57] ABSTRACT

An apparatus and method for recovering from read errors detected by a read channel (70) in a sequence of data read from a disc (18) of a disc drive (10) by using read channel quality indicators to determine the appropriateness of using error correction in combination with other corrective actions utilized in the recovery process. Upon the detection of an uncorrected error in the retrieved data, the disc drive (10) enters a read error recovery routine wherein one or more corrective actions (102, 122) are applied in an effort to resolve the error. One of the channel quality indicators comprises a channel quality measurement (108, 128) determined as the sum of the square of the sampled data bit error values recovered during the read operation. When the channel quality measurement is at or below a threshold value indicative that the probability of passing undetected erroneous data is at an acceptable level (110, 130), error correction is applied to the data (112, 138); otherwise, error correction is disallowed (118, 140). Additional channel quality indicators comprise erasure pointers (132) which identify a particular set of symbols that are suspected of containing a read error. In such a case, the disc drive determines that the total number of symbols identified by the erasure pointers is below a predetermined erasure threshold before applying error correction (134, 136, 138), the erasure threshold selected to be within the correction capability of error correction circuitry 90.

16 Claims, 5 Drawing Sheets

READ ERROR RECOVERY UTILIZING ECC AND READ CHANNEL QUALITY INDICATORS

This application is a 371 of PCT/US97/04906 filed Mar. 27, 1997 and provisional application No. 60/017,769 filed May 15, 1996.

TECHNICAL FIELD

This invention relates generally to the field of disc drive data storage devices, and more particularly, but not by way of limitation, to a method and apparatus for improving read error recovery operations in a disc drive through the of read channel quality indicators.

BACKGROUND ART

Disc drives are commonly used in workstations, personal computers, laptops and other computer systems to store large amounts of data in a form that can be made readily available to a user. Such drives store and retrieve data using one or more magnetizable discs that are rotated at a constant high speed by a spindle motor. Each of the discs has a magnetizable surface coating that can be selectively magnetized by a corresponding read/write head so that the data is stored in the form of magnetic flux transitions along defined data tracks on the surface of the disc.

The heads are typically suspended over the discs and positionably controlled with respect to the tracks on the discs through the use of a rotary actuator assembly and a servo loop. The servo loop obtains position information from servo fields on the discs and, in response thereto, corrects the radial position of the heads through application of current to an actuator coil. The coil is part of a voice coil motor, which as will be recognized comprises one or more permanent magnets which establish a magnetic field through which the coil moves; the magnetic interaction between the magnetic field of the permanent magnets and magnetic fields established in the coil as a result of the coil current causes the rotary actuator to position the heads as desired over the surfaces of the discs.

Heads can be of a variety of constructions, including thin film and magneto-resistive (MR). Both of these well known types of heads generally write data to a corresponding disc through the application of a write current of a selected duration, magnitude and direction to a write element of the head, the write element including a magnetic coil with a relatively small air gap. The gap, disposed in close proximity to the surface of the rotating disc, selectively magnetizes the disc as a result of the magnetic fields established across the gap in response to the write current. The approaches taken by thin film heads and MR heads to read data from the disc, however, are rather different. A thin film head senses magnetic transitions from a gap of a read element (which may or may not be the same as the write element) and outputs a read signal indicative of the selective changes in magnetization of the selected data track being read; an MR head, on the other hand, typically includes a magneto-resistive element characterized in that the presence of a magnetic field of a particular orientation changes the nominal dc resistance of the MR-element. Thus, variations in the magnitude of a predetermined read current passed through the MR-element during a read operation are taken as resulting from the interaction between the MR-element and flux transitions on the disc and such variations are translated into a read signal.

A read channel is typically provided to convert the read signal obtained from a selected head to the user data which was originally stored on the selected track. Such read channels are well known and can utilize a variety of signal processing techniques, including peak detection and partial response, maximum-likelihood (PRML) processing. To ensure reliable storage and retrieval operations by the disc drive, the user data is typically encoded with run length limited (RLL) and error correction codes (ECC) before being serially written to disc. As will be recognized, RLL encoding is provided to ensure the generation of appropriate read timing windows for the read channel and ECC is used to detect and correct up to a selected number of errors in the retrieved sequence. Thus, typical read channel operation includes RLL decoding and ECC operations upon the retrieved read signal in order to ultimately reconstruct the user data.

Error correction codes are a powerful tool for extracting the correct data from the disc in the presence of noise in the read channel and micro-defects in the magnetic media. Each type of code, however, has a finite probability of passing undetected erroneous data, either because the error pattern was not detected by the code, or because the code miscorrected the error. In each of these cases, the size of the error pattern will have generally exceeded some explicit threshold, the value of which is a parameter of the particular ECC employed. The probability of passing undetected erroneous data is a function of the error rate of the data provided to the portion of the channel performing the ECC operation. For more background concerning general ECC techniques, see U.S. Pat. No. 5,276,662 issued Jan. 4, 1994 to Shaver et al., as well as U.S. patent application Ser. No. 08/393,431 filed Feb. 23, 1995 by Deng et al. Both of these references are assigned to the assignee of the present invention.

ECC is typically used during normal operation of the read channel, but not during read error recovery operations out of a concern that such read error recovery operations might result in a degraded error rate. For example, it is common for a disc drive upon the detection of an erroneous, uncorrectable sequence in the retrieved data, to enter a read error recovery mode wherein the data is reread from the disc and various corrective actions are sequentially applied in an attempt to resolve the error. One such corrective action involves the application of a track offset, wherein the data head is offset from track center by a selected percentage of the total track width (for example, +10%). This technique can be helpful in resolving the error if the data was accidentally written off of track center, if a media defect is located at the edge of the data track, or if adjacent track data encroaches into one side of the target data. Because error rates generally degrade as the heads are moved away from the written center of the track, ECC has historically not been applied while reading data with track offsets for fear of operating in a region with an unacceptable probability of passing undetected erroneous data. Other corrective actions wherein it has been historically undesirable to apply ECC include changes in gain, timing and weight thresholds used by various components in the read channel.

There is a need, therefore, for an improved approach to recovering from read errors in a read channel which facilitates the use of ECC during the read recovery process in combination with corrective actions which typically have the potential of degrading the overall read error rate below acceptable limits for the ECC.

DISCLOSURE OF INVENTION

The present invention provides a method and apparatus for recovering from read errors detected in a sequence of data read from a disc of a disc drive by using read channel quality indicators to determine the appropriateness of using ECC correction in combination with other corrective actions utilized in the recovery process.

Generally, upon the detection of an uncorrected error in the retrieved data, the disc drive enters a read error recovery routine wherein one or more corrective actions are applied in an effort to resolve the error; such corrective actions can include track offsets, adjustments in amplifier gain and filter ranges and adjustments in read channel equalizer parametrics. Whether ECC correction is enabled in conjunction with the corrective action is determined by the particular read channel quality indicators employed.

More particularly, in a first aspect of the present invention the channel quality indicator comprises a channel quality measurement determined as the integral, or sum, of the square of the sampled data bit error values recovered during the read operation. The magnitude of this sum is representative of the overall quality of the data signal during the read event; a lower sum corresponds to a higher quality signal.

At such times that the channel quality measurement is at or below a threshold value indicative that the probability of passing undetected erroneous data is at an acceptable level, ECC correction is applied to the data; on the other hand, when the channel quality measurement provides an indication that the probability of passing undetected erroneous data is not at an acceptable level, ECC correction is disabled during the read recovery operation. In either case, if the corrective action (with or without ECC correction) is successful in correcting the read error, the correct data is output to a disc drive interface buffer for subsequent transfer to the host computer. If unsuccessful, the next corrective action is selected and the process is repeated until the read error is resolved or an unrecoverable read error condition is declared by the disc drive.

Further, in a second aspect of the present invention, erasure pointers are used as additional channel quality indicators which factor into the decision whether to apply ECC in combination with the selected corrective action. Erasure pointers identify a particular symbol (byte) or a plurality of symbols that are suspected of containing a read error and can be generated from a signal level threshold detector used to detect the occurrence of thermal asperities in conjunction with an MR head; additionally, erasure pointers can be generated from an RLL decoder used to convert n+k bits of data written to the disc media to the n bits of user data supplied to the disc drive write channel. For example, with an 8/9 decoder, 9 bits of data are written to the disc for every 8 bits of user data, so 256 of the 512 combinations that could potentially be received by the 8/9 decoder would be considered "illegal" and indicative of an erroneous byte. The total number of bytes which are identified by erasure pointers correctable by the ECC is a function of the ECC methodology employed. Accordingly, in the second aspect of the present invention the recovery routine not only determines whether the channel quality measurement provides an indication that the probability of passing undetected erroneous data is at an acceptable level, but further determines that the total number of symbols identified by erasure pointers is below a threshold selected to be within the correction capability of the ECC circuitry before applying ECC correction.

These and various other features as well as advantages which characterize the present invention will be apparent from a reading of the following detailed description and a review of the associated drawings.

BRIEF DESCRIPTION OF DRAWINGS

FIG. 6 is a flow chart of a read error recovery routine in accordance with a preferred embodiment of the present invention.

BEST MODES FOR CARRYING OUT THE INVENTION

Figure 1:
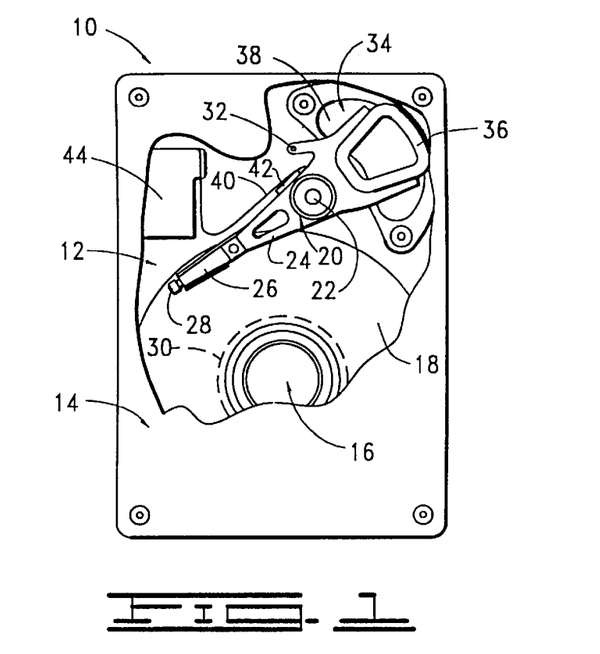
FIG. 1 is a top plan view of a disc drive constructed in accordance with the preferred embodiment of the present invention.

Turning now to the drawings and more particularly to FIG. 1, shown therein is a top plan view of a disc drive 10 constructed in accordance with the present invention. The disc drive 10 includes a base deck 12 to which various disc drive components are mounted and a top cover 14, which is shown in a partial cut-away fashion to expose selected components of interest. Although not explicitly illustrated in the top plan view of FIG. 1, it will be readily understood that the base deck 12 includes an interior surface to which various disc drive components are mounted as well as side walls which, in combination with the top cover 14, provide sufficient height to house these components within a sealed internal environment.

Mounted to the base deck 12 is a spindle motor (shown generally at 16) to which a plurality of discs 18 are mounted for rotation at a constant high speed. Adjacent the discs 18 is an actuator assembly 20 which pivots about a pivot bearing assembly 22 in a rotary fashion. The actuator assembly 20 includes actuator arms 24 which support gimbal assemblies 26. The gimbal assemblies 26 in turn support heads 28, with each of the heads 28 corresponding to a surface of one of the discs 18. As provided hereinabove, the heads 28 are positionably located over data tracks (not shown) of the discs 18 in order to read data from and write data to the tracks. At such time that the disc drive 10 is not in use, the heads 28 are moved to landing zones (denoted at broken line 30), which are located in FIG. 1 near the inner diameter of the discs 18. A latching arrangement (shown generally at 32) is used to secure the actuator assembly 20 when the heads 28 are moved to the landing zones 30.

Continuing with FIG. 1, the actuator assembly 20 is controllably positioned by way of a voice coil motor (VCM, shown generally at 34) comprising an actuator coil 36 immersed in the magnetic field generated by a permanent magnet 38. It will be recognized that a magnetically permeable flux path (such as a second permanent magnet in conjunction with a steel plate) is mounted above the actuator coil 36 to complete the magnetic circuit of the VCM 34, but for purposes of illustration this flux path has not been shown in FIG. 1. When controlled DC current is passed through the actuator coil 36, an electromagnetic field is set up which interacts with the magnetic circuit of the VCM 34 to cause the actuator coil 36 to move relative to the permanent magnet 38 in accordance with the well-known Lorentz relationship. As the actuator coil 36 moves, the actuator assembly 20 pivots about the pivot bearing assembly 22, causing the heads 28 to move across the surfaces of the discs 18.

To provide the requisite electrical conduction paths between the heads 28 and disc drive read/write circuitry (not shown in FIG. 1), head wires (not separately shown) are routed on the actuator assembly 20 from the heads 28, along the gimbal assemblies 26 and the actuator arms 24 to a flex circuit assembly 40. The head wires are secured to corresponding pads of a flex circuit board 42. In turn, the flex circuit assembly 40 is connected to a flex circuit bracket 44 in a conventional manner and communication is provided between the flex circuit bracket 44 and a printed circuit board (PCB) mounted to the underside of the disc drive 10 (the PCB is not shown in FIG. 1). As will be recognized, the PCB houses the control electronics for the disc drive 10.

Figure 2:
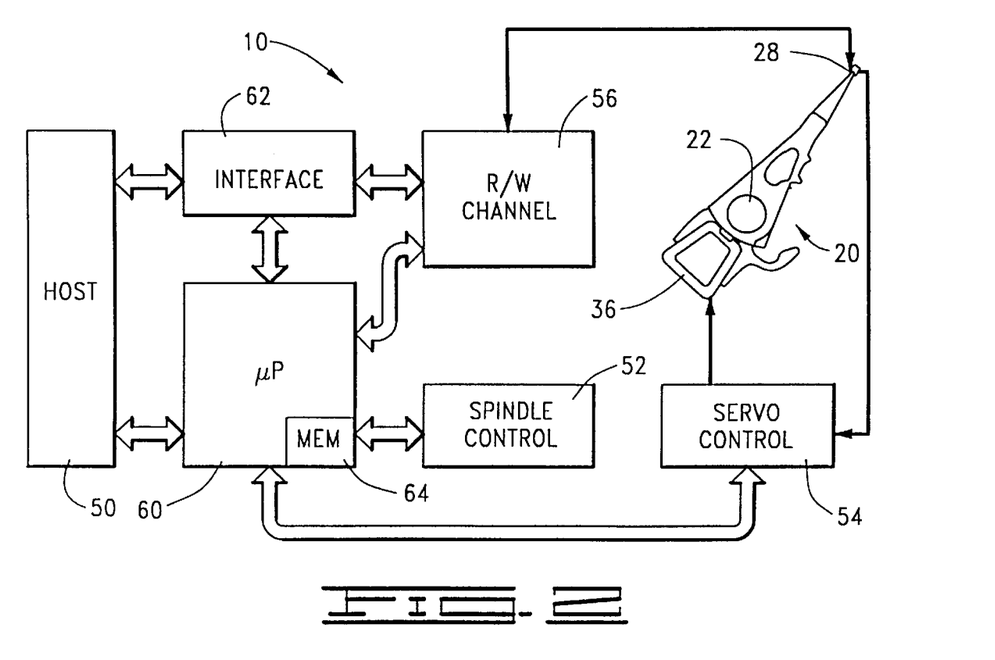
FIG. 2 is a functional block diagram of the disc drive of FIG. 1.

FIG. 2 provides a functional block diagram of the disc drive 10 of FIG. 1, operably connected to a host computer 50. As shown in FIG. 2, the disc drive 10 generally comprises a spindle control circuit 52, a servo control circuit 54 and a read/write channel 56, all operably connected to a system microprocessor 60. It will be recognized that the system microprocessor 60 communicates with and controls the operation of these circuits in a known manner, with the exceptions as discussed below. Additionally, an interface circuit 62 is shown connected to the read/write channel 56 and to the system microprocessor 60, with the interface circuit 62 serving as a conventional data interface and buffer for the disc drive.

As will be recognized, the spindle control circuit 52 controls the rotational speed of the spindle motor 16 (FIG. 1). As the construction and operation of the spindle control circuit 52 are conventional, these will not be further discussed herein.

The servo control circuit 54 of FIG. 2 is shown to receive servo position information from the head 28 and, in response thereto, provides a correction signal to the actuator coil 36 in order to position the head 28 with respect to the disc 18 (FIG. 1). As will be recognized, a dedicated servo system generally entails the use of at least one surface of the discs 18 as a dedicated servo surface, from which the alignment of the remaining heads relative to the corresponding disc surfaces can be achieved; alternatively, an embedded servo system entails the storage of both servo information and user data on each track on each of the surfaces of the discs. Although the disc drive 10 is shown to be an embedded servo system as both data and servo information are provided from the head 28 of FIG. 2, it will be understood that the present invention is not so limited. For additional discussion regarding typical disc drive servo systems, see U.S. Pat. No. 5,262,907 issued Nov. 16, 1993 to Duffy et al. (dedicated servo system) and U.S. Pat. No. 5,136,439 issued Aug. 4, 1992 to Weispfenning et al. (embedded servo system). Both of these references are assigned to the assignee of the present invention.

The read/write channel 56 operates to write data to the disc 18 in response to user data provided to the channel from the interface circuit 62 by encoding and serializing the data and generating a write current utilized by the head 28 to selectively magnetize portions of a selected track on the disc 18. Correspondingly, the previously stored data is retrieved by the read/write channel 56 by reconstructing the data from the read signals generated by the head 28 as the head passes over the selected track on the disc 18. The operation of the read/write channel 56 in accordance with the preferred embodiment of the present invention will be discussed in greater detail below.

It will be noted that the various operations of the disc drive 10 are controlled by the system microprocessor 60, in accordance with programming stored in system microprocessor memory (MEM) 64. Those skilled in the art will recognize that typical disc drives include additional circuitry and functions beyond those delineated above, but such are only of general interest to the present discussion and accordingly do not warrant further description.

Figure 3:
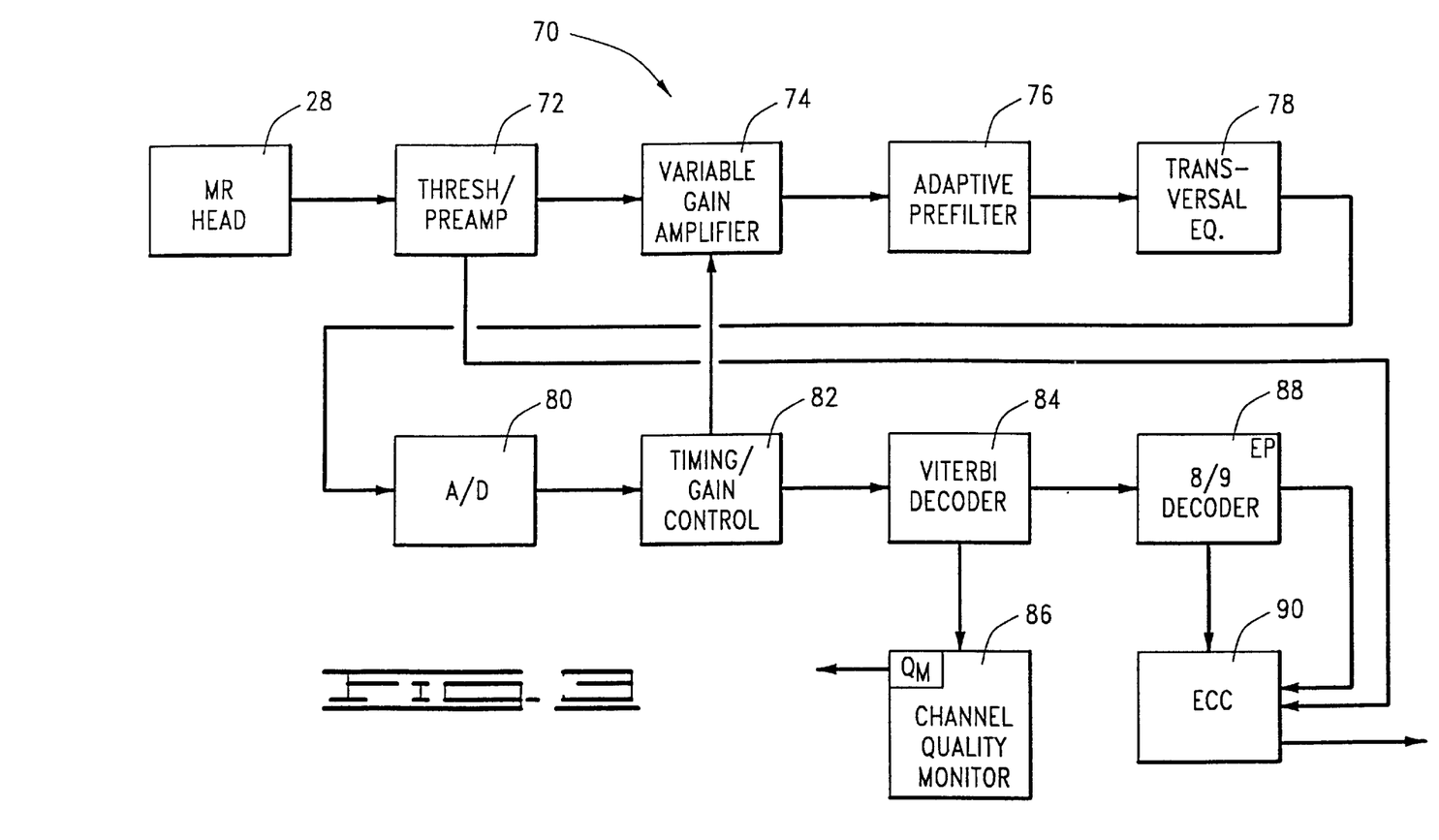
FIG. 3 is a functional block diagram of the read channel portion of the read/write circuit of FIG. 2.

Referring now to FIG. 3, shown therein is a functional block diagram of a read channel 70 of the disc drive 10, the read channel 70 composing the readback portion of the read/write channel 56 of FIG. 2. It will be recognized that additional components and features may typically be provided in the read channel 70 and further, selected operations of several of the components disclosed in FIG. 3 are controlled with external inputs provided from, for example, the system microprocessor 60 of FIG. 2; however, the read channel 70 of FIG. 3 is sufficiently detailed, in conjunction with the following description, to readily facilitate a thorough understanding of the present invention.

The read channel 70 employs PRML signal processing, which as will be recognized involves time-domain equalization and self-synchronization of the read signal provided by the head 28. Particularly, time-domain equalization is used to reshape a readback signal received by the channel to an approximation of a desired target waveform in the time domain, such as used in PRML PR-4 detection. Reshaping the readback signal allows intersymbol interference (ISI) to be reduced and controlled, facilitating reliable sequential decoding of the digital information stored on the disc. Such time-domain equalization is typically implemented through the use of a transversal equalizer/filter circuit. Moreover, self-synchronization involves synchronization of the rate of data recovery with the rate of incoming readback signals, which varies as a result of the speed of the rotating disc and the radial position of the associated head. Typically, such self-synchronization is practically achieved through the use of a phase locked loop (PLL) which generates clock signals for the sampling of equalized signals at appropriate moments and for die subsequent recovery of the stored data from the samples by way of a Viterbi decoder. Practical PRML read channel implementations are discussed, for example, in U.S. Pat. No. 5,422,760, issued Jun. 6, 1995 to Abbott et al. (digital equalizer, timing and decoder circuitry), U.S. Pat. No. 5,459,757 issued Oct. 17, 1995 to Minuhin et al. (analog timing and decoder circuitry) and U.S. Pat. No. 5,592,340 issued Jan. 7, 1997 to Minuhin et al. (analog equalizer circuitry). It will be readily understood, however, that although the present invention is particularly suited to a channel employing PRML signal processing, the present invention is not so limited.

Continuing with FIG. 3, the read channel 70 is shown to comprise a threshold detector and preamp circuit 72 which operates to monitor the variations in the read current passing through the head 28, which is identified in FIG. 3 as an MR head. The detector and preamp circuit 72 provides both threshold detection and preamplification of the signal provided by the head 28.

More particularly, the detector and preamp circuit 72 monitors the variations in magnitude of current passing through the MR-element of the head 28 and provides indications when the current exceeds a predetermined threshold bounding the nominal read current. Such detection is useful, for example, in detecting the occurrence of a thermal asperity which is an event wherein the head 28 undergoes a sudden change in temperature, affecting the nominal resistance of the MR-element sufficiently to produce noise in the read data sequence. A contact thermal asperity occurs when the head 28, flying in close proximity to the surface of the disc 18, contacts a particle disposed upon the surface of the disc; the sudden heating as a result of the impact can cause the read signal threshold to be surpassed by a pulse which significantly distorts the read signal output by thethreshold and preamp circuit 72 for a period of time that can potentially last for several clock cycles. A non-contact thermal asperity occurs when the topography of the disc underneath the path of the head 28 changes sufficiently to affect the rate of heat dissipation from the MR-element, and hence the steady-state resistance thereof; a peak or a valley in the surface of the disc having sufficient relative dimension to the flying height of the head 28 can cause signal distortion in the output of the threshold and preamp circuit 72 as the resistance of the MR-element fluctuates accordingly. Thus, the threshold and preamp circuit 72 utilizes a predetermined signal level threshold for the read current and provides indications when the threshold has been exceeded.

Additionally, the threshold and preamp circuit 72 provides preamplification of the read signal from the head 28 to a level sufficient for processing by the remainder of the read channel 70.

The output signal from the threshold and preamp circuit 72 is provided to a variable gain amplifier (VGA) 74, which typically includes automatic gain control (AGC) to maintain a nominal signal amplitude for the remainder of the read channel 70. Additionally, the VGA 74 can be set to a fixed gain, useful for certain error recovery operations.

The amplified signal is then prefiltered by an adaptive prefilter 76 which generally operates as a low pass filter to remove higher frequency noise components from the signal. A transversal equalizer 78 then performs the aforementioned time-domain equalization of the readback signal, filtering the signal to a close approximation of a selected class of PRML signaling (in this case PR-4). The output of the transversal equalizer 78 is sampled (digitized) by an analog to digital (A/D) converter 80, and these samples are used by a timing and gain control circuit 82 to adjust the gain of the VGA 74, as well as to adjust the frequency of a PLL (not separately shown) used by a Viterbi decoder 84 to decode read data from the samples obtained from the transversal equalizer 78.

The output from the Viterbi decoder 84 will optimally comprise a data sequence corresponding to the encoded data originally written to the selected track. This sequence is provided to a channel quality monitor 86 as shown, which as will be recognized performs a running assessment of the channel quality using error values provided by the Viterbi decoder 84. More particularly, the channel quality monitor 86 generates a status byte which represents the integral, or sum, of the square of the sampled data bit error values recovered during the read operation. The magnitude of this status byte ("channel quality measurement") is representative of the overall quality of the data signal during the read event; a lower magnitude corresponds to a higher quality signal. Because the individual sample errors are squared, larger errors generally carry much more significance than smaller errors in the overall count.

For example, if the A/D 80 produces sample values over a symmetrical integer range (such as −18 to +18), then every sample received by the Viterbi decoder 84 should have one of three values corresponding to symbol values of −1, 0 and +1 (such as −14, 0, or +14). Thus, samples other than these will have non-zero error values.

The Viterbi decoder 84 examines each sequence of sampled data values and determines the sequence of −1, 0, and +1 symbol values which most likely produced the recovered sequence. Once the Viterbi decoder 84 has determined the symbol values, it can determine the corresponding error values, and those error values are provided to and squared by the channel quality monitor 86 where they are added to a summing register (identified at $Q_m$ in FIG. 3).

It is advantageous to linearly scale the squared error values before being summed and then to linearly scale the resulting sum, so that the final status fits in a single-byte register. When a new sector of data is read, the channel quality monitor 86 clears the summing register during receipt of the associated phase-locked loop (PLO) recovery field and then begins adding the calculated squares of the error values when data recovery begins. As desired, a root mean squared (RMS) integral of error" can readily be determined for the quality measurement by further dividing the sum by the total number of bits received and then taking the square root of this value. It will be recognized that the calculation of the channel quality measurement is generally known in the art.

Figure 4:
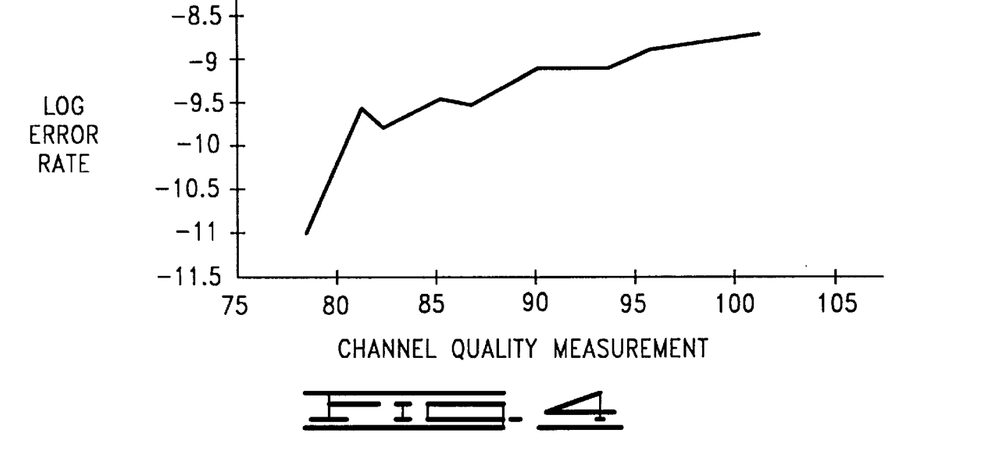
FIG. 4 is graphical representation of the correlation between channel quality measurement and read error rate for the read channel of FIG. 3.

Regardless of the manner in which the channel quality monitor 86 determines the channel quality measurement, it is possible to experimentally correlate the channel quality measurement to the overall channel read error rate. For purposes of illustration, FIG. 4 provides a graphical representation of the correlation between channel quality measurement and the read error rate for the disc drive 10. As shown in FIG. 4, a channel quality measurement of about 78 corresponds to a read error rate of about $1 \times 10^{-11}$ read errors/bit retrieved from the read channel 70, whereas a channel quality measurement of about 90 corresponds to a read error rate of about $1 \times 10^{-9}$ read errors/bit. The significance of the channel quality measurement and this correlation to read error rate in view of the present invention will be discussed in greater detail below.

Continuing with FIG. 3, the recovered data sequence is provided by the Viterbi decoder 84 to a conventional 8/9 decoder 88, which converts each set of 9 bits stored to the disc 18 back to the original 8 bits of user data to remove the RLL encoding used to ensure reliable timing during the read recovery process. Although 8/9 encoding has been disclosed, it will be understood that other encoding rates can readily be utilized, such as 16/17. The output from the 8/9 decoder 88 is shown to be provided to an ECC circuit 90, which performs error detection and correction upon the received sequence (using, for example Reed-Solomon codes) and, if no uncorrectable errors are present, outputs the data to the interface circuit 62 (FIG. 2) for subsequent transfer to the host computer 50.

As is well known, ECC encoding is initially performed by the write channel portion of the read/write channel 56 by appending a number of code symbols to the end of each selected portion of data symbols to generate encoded words (or interleaves) that mathematically map into a Galois field. That is, the code symbols are added to the data symbols so that the total set of symbols can be considered to be the coefficients of a polynomial having defiled roots, so that only mathematically defined combinations can legally exist. When an encoded word is retrieved, the word is compared to the set of defined combinations, so that encoded words containing read errors will generally not map into the set of defined combinations; thus, based upon the algorithm used by the ECC circuitry, illegal combinations can be detected and up to a selected number of the data symbols in such words can be changed in order to correct the presence of read errors therein. Once the data has been corrected, the code bits are stripped, allowing the originally recorded data to be output by the ECC circuit 90 to the interface circuit 62 and then on to the host computer 50. The ECC circuit is preferably implemented in hardware so that on-the-fly detection and correction can take place without the need for firmware intervention.

As will be recognized, different algorithms, or levels of ECC correction, can be used with the same encoding scheme to detect and correct different numbers of errors in the retrieved encoded words, or to provide different probabilities of detection and correction. Risks associated with ECC correction generally include both the erroneous correction of correct data and the non-detection of read errors in the retrieved data. Thus, an optimal level of ECC correction is typically chosen which balances the number of correctable errors, the probability of miscorrection of errors and the probability of misdetection of errors.

Figure 5:
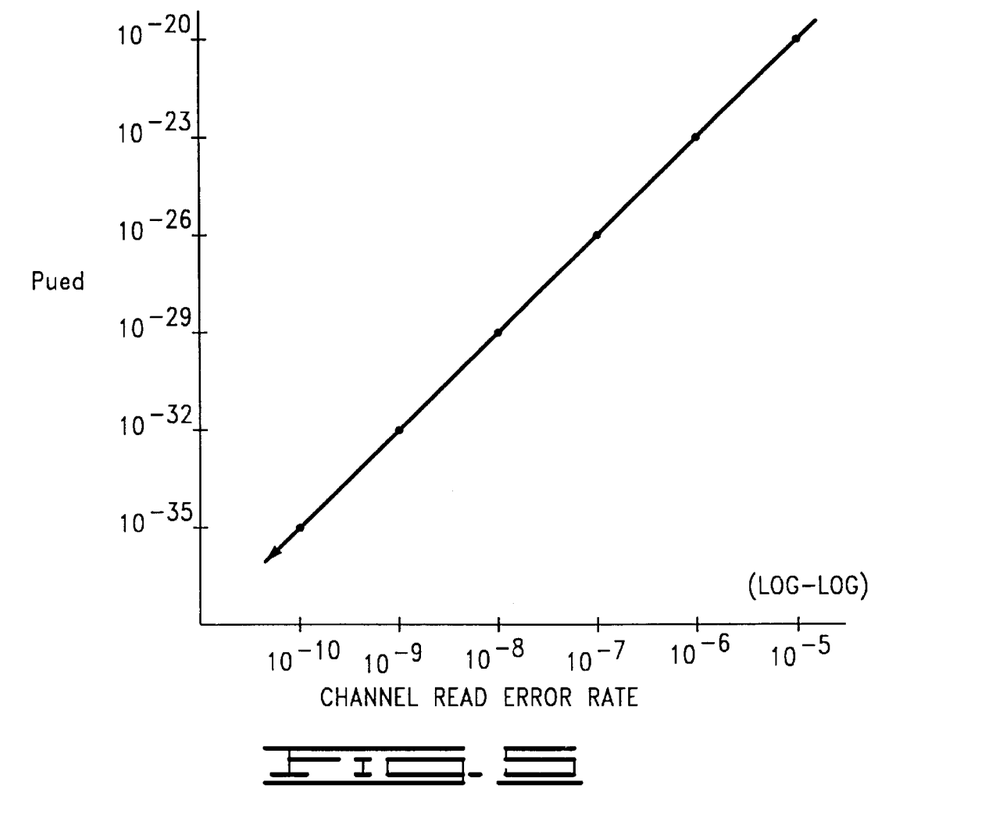
FIG. 5 is a graphical representation of the correlation between the probability of outputting undetected erroneous data and the read error rate of the read channel of FIG. 3.

As discussed above, the probability of passing undetected erroneous data is a function of the error rate of the data provided by the read channel 70 (this probability is referred to herein as "$P_{ued}$"); for purposes of illustration, FIG. 5 provides an example of this relationship for the disc drive 10. As shown in FIG. 5, if a threshold of acceptable $P_{ued}$ is $1 \times 10^{-32}$ (determined, for example, by customer specifications), then $1 \times 10^{-9}$ would be a corresponding acceptable read channel error rate.

Having concluded an initial overview of the read channel 70 of FIG. 3, a first aspect of the present invention will now be discussed, which involves the use of the channel quality measurement to determine whether the probability of passing undetected erroneous data is sufficiently low to warrant use of the ECC circuit 90 during a read error recovery process. As discussed above, it is common upon the receipt of a detected uncorrectable error to reread the sector containing the erroneous data (or a portion of this sector) and to further employ a sequence of corrective actions in order to resolve the read error. Such corrective errors include, for example, using track offsets, holding the gain of the VGA 74 to a predetermined level, switching the filter bandwidth of the threshold and preamp circuit 72 or the adaptive prefilter 76, varying the thresholds used by the Viterbi decoder 82, and varying the tap weight or adaptive timing parameters used by the transversal equalizer 78. In each case, the system microprocessor 60 (FIG. 2) will generally cause the rereading of the particular sector (or portion thereof) from which the read error emanates while applying one or more of the above, or other similar, corrective actions in order to eliminate the read error.

Upon receipt of an uncorrectable read error, the present invention contemplates the application of a selected corrective action, rereading the data from the disc 18 and determining the channel quality measurement therefrom; at such tinge that the channel quality measurement indicates that the overall read error rate of the channel will provide an acceptable $P_{ued}$, then the disc drive 10 further allows error correction to be performed by the ECC circuit 90 upon the retrieved data. FIG. 6 provides a generalized flow chart corresponding to programming stored in the system microprocessor memory 64 and utilized by the system microprocessor 60 to carry out this read error recovery operation.

Referring to FIG. 6, after receipt of an uncorrected error detected by the ECC circuit 90 (and after unsuccessfully attempting to resolve the read error by rereading the sector associated with the error), the disc drive 10 enters a read error recovery routine, which begins with the selection of the first of a series of corrective actions for use in the recovery effort, as indicated by block 102. As provided hereinabove, such corrective actions can involve track offsets and adjustment of various channel parameters; in the preferred embodiment, these corrective actions are organized in the form of a table in memory (such as the system microprocessor memory 64) so that the first corrective action to be taken is selected from the table at block 102. The summing register ($Q_m$ register) of the channel quality monitor 86 is cleared at this time as well, as indicated by block 104, so that the effects of the selected corrective action upon the channel quality can be subsequently assessed.

The routine of FIG. 6 continues at block 106, wherein the selected corrective action is applied to the read channel 70 and the associated data containing the error (such as the entire sector or a portion thereof) is reread. For purposes of illustration, should the first corrective action comprise performing a track offset of +10% from track center, the system microprocessor 60 (FIG. 2) instructs the servo control circuit 54 to adjust the current applied to the actuator coil 36 in order to move the head 28 a distance equal to 10% of the nominal width of the selected track in the positive direction with respect to the disc (for example, towards the disc inner diameter). The system microprocessor 60 instructs the read channel 70 to reread the data with the head 28 in this offset position. The read channel 70 then generally operates in accordance with the foregoing description to reread the associated data, including the operation of the channel quality monitor 86 (FIG. 3) to determine a channel quality measurement therefor. The system microprocessor 60 will then obtain the channel quality measurement, as shown by block 108, and compare this to a predetermined threshold, as shown by block 110, which is determined from the previously identified acceptable $P_{ued}$. Thus, using the example provided above, an acceptable $P_{ued}$ of $1 \times 10^{-32}$ corresponds to a raw read error rate of $1 \times 10^{-9}$ (FIG. 5), which in turn means that the channel quality measurement should have a value of below 90 (FIG. 4) in order to assure this $P_{ued}$ is maintained. Block 110 indicates this comparison of the channel quality measurement to this threshold.

When the channel quality measurement is below the predetermined threshold, the routine of FIG. 6 continues at block 112 wherein ECC correction is allowed to take place. That is, the ECC circuit 90, which as described above is implemented in hardware and performs on-the-fly correction, operates to detect and correct errors in the set of symbols received from the 8/9 decoder 88. Decision block 114 determines whether any uncorrectable errors are present (through polling of the ECC circuit 90 by the system microprocessor 60), and if not, the data is output to the interface circuit 62 (FIG. 2) for subsequent transfer to the host computer 50, as indicated by block 116. Because the channel quality measurement indicates an acceptable read error rate in the channel 70, it is safe to assume the ECC circuit 90 will operate properly to correct any errors it detected in the data (up to the maximum number of errors the ECC circuit 90 is designed to correct).

However, should the channel quality measurement not fall below the threshold of decision block 110, error correction by the ECC circuit 90 is disallowed, as indicated by block 118. That is, even though the ECC circuit 90 will proceed to operate as designed to perform error detection and correction upon the data, it is not safe to assume that any actual corrections made by the ECC circuit 90 will be valid corrections. Accordingly, the reread data can still be output to the interface circuit 62 (as indicated by block 116) when the channel quality measurement is above the threshold of block 110, but only in those cases when the ECC circuit 90 detects no errors in the received set of data symbols.

Thus, when error correction is allowed (block 112), decision block 116 determines whether any remaining uncorrectable errors remain after the ECC circuit 90 has performed error correction upon the data. Correspondingly, when error correction is disallowed (block 118), decision block 114 determines whether any errors are detected by the ECC circuit 90. At such time that at least one uncorrectable error remains (whether correction is allowed or disallowed), the output from the ECC circuit 90 is discarded and the routine passes from decision block 114 back to block 102, wherein the next corrective action from the table is selected. It will be understood that the routine of FIG. 6 will continue operation, cycling through the corrective actions set forth in the table until the read error is ultimately resolved, or until an unrecoverable error condition is declared and the host computer 50 is notified accordingly.

In order to assess the effectiveness of each corrective action applied to the read channel 70 during the routine of FIG. 6, it will be recognized that in the embodiment discussed above the $Q_m$ register is cleared for each pass through the routine. It may be desirable, however, to continue to accumulate the channel quality measurement over subsequent passes through the routine so that step 104 may be bypassed as required. It is contemplated that such accumulation may be desirable for cases wherein, for example, subsequent corrective actions listed in the table (block 102) are identical; that is, it is common to perform the same corrective action a plurality of times in succession (such as application of a +10% offset twice in a row) and, in such a case, accumulation of the channel quality measurement for the entire time that the same corrective action is performed could in some instances provide a better overall assessment of the channel quality, and hence the effectiveness of the corrective action. Of course, the channel quality monitor 86 could also be instructed to continue to accumulate the channel quality measurement during the entire course of the read recovery routine, over all the corrective actions applied; the benefits from obtaining a larger sampling of bits thereby (especially when the previously described RMS approach is utilized), however, might not be as beneficial as retaining the ability to separately evaluate the effects of each type of corrective action applied to the read channel 70.

Having now concluded the discussion regarding the routine of FIG. 6, the present discussion will turn to the second aspect of the present invention which involves the further use of erasure pointers during the read error recovery process to determine the appropriateness of applying ECC in combination with corrective actions utilized during the read error recovery process. As will be recognized, an erasure pointer is an output from a selected component of the read channel 70 which, as a result of the operation of the selected component, serves to identify a particular set of data (such as a particular byte or set of bytes) as potentially containing a read error. For example, one source of erasure pointers is the threshold and preamp circuit 72 (FIG. 3), which as described above includes in its operation a signal level threshold detector which monitors the signal level of the read signal provided by the MR head 28. Accordingly, if the amplitude of the read signal from the head 28 exceeds the thermal asperity threshold, signal saturation is likely and proper decoding by the read channel 70 is unlikely. The erasure pointer information can thus be provided to the ECC circuit 90 for the affected bytes (also referred to herein as "erasures").

A second erasure pointer source in the read channel 70 is the 8/9 decoder; because the 8/9 decoder converts the 9 bits of encoded data written to the disc 18 to 8 bits of user data, 256 of the 512 possible combinations of 9 bits are illegal; hence, detection of such a combination suggests an erroneous byte which can be ncsU corrected by the ECC circuit 90.

The ECC circuit 90 has the capability of correcting up to a maximum of t erroneous data symbols or 2t erasures, as is conventional in the art. In other words, the ECC circuit 90 can correct up to v errors and u erasures, provided that:

$$u/2 + v \leq t \tag{1}$$

As disc drives typically store 512 bytes of data per sector on the discs and typically employ Reed-Solomon encoding schemes using one code word for (up to) 255 bytes of data, each sector of data will typically have three to four code words for the data symbols stored in the sector (a code word comprises both data symbols and code symbols). Accordingly, as the ECC circuit 90 preferably can correct up to four errors in the data symbols associated with each code word (i.e., t=4), then it can alternatively correct up to eight erasures in the data symbols for each code word (i.e., 2t=8); for a sector having four code words, then up to 16 errors or up to 32 erasures can be corrected by the ECC circuit 90 for the data stored in the sector. As discussed below, in accordance with the present invention an erasure threshold is selected at a level within the capability of the ECC circuit 90, with a lower threshold generally corresponding to a more conservative recovery attempt. For example, using t=4 for the ECC circuit 90, the erasure threshold (per code word) should preferably be set to a value of from zero to eight.

Figure 7:
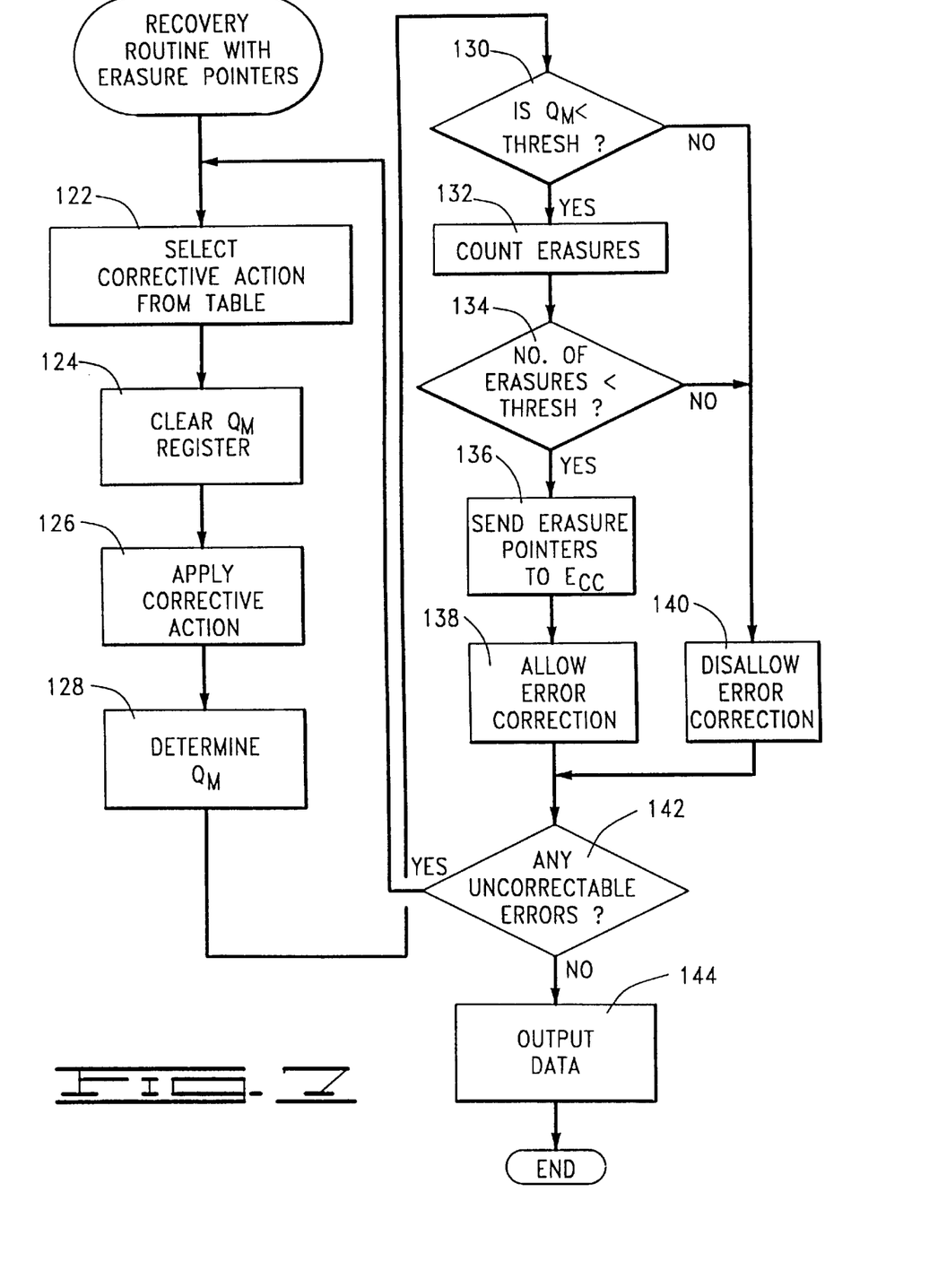
FIG. 7 is a second read error recovery routine in accordance with another preferred embodiment of the present invention.

Referring now to FIG. 7, shown therein is a generalized flow chart for a read recovery routine which is similar to the routine of FIG. 6, except that the routine of FIG. 7 includes the further use of erasure pointers in the determination of the appropriateness of the use of ECC correction during the recovery operation. Like the routine of FIG. 6, the routine of FIG. 7 is initiated after the occurrence of a detected uncorrected error by the ECC circuit 90; at block 122, the first C; corrective action is selected from the table. The $Q_m$ register is cleared, block 124, and then the selected corrective action is applied to the associated data, block 126.

The routine determines the associated channel quality measurement at block 128 and, as before, compares this to a predetermined threshold at decision block 130. At such time that the channel quality measurement indicates that the $P_{ued}$ is at an acceptable level, the routine continues to block 132 wherein the total number of distinct erasures indicated by the erasure pointers is determined. As provided above, a separate erasure pointer is provided for each byte (symbol) of data suspected to contain an error as a result of a thermal asperity or a detected erroneous 8/9 combination. The total number of distinct erasures is determined, because a byte affected by a thermal asperity and detected by the threshold and preamp circuit 72 may also be detected as an illegal combination by the 8/9 decoder, but this affected byte will count as only one erasure. The system microprocessor 60 determines the total number of distinct erasures and compares this number to a predetermined threshold (i.e., between zero and eight, based on the correction capabilities of the ECC circuit 90) at decision block 134. At such time that the total number of erasures is within the correction capability of the ECC circuit 90, the erasure pointers are provided to the ECC circuit 90 and ECC correction is allowed to be performed on the reread data as shown by block 150. Alternatively, should either the channel quality measurement fail to indicate an acceptable level of $P_{ued}$ (decision block 130), or the total number of erasures is greater than the erasure threshold (decision block 134), then ECC correction is disallowed as indicated by block 140.

As before, regardless whether ECC correction is allowed, the routine determines whether any uncorrectable errors remain in the reread data at decision block 142 and proceeds to output the same when no such errors are detected (block 144). Alternatively, should read errors continue to exist in the reread data, the routine returns back to block 132 and the next corrective action in the table is applied. As with the routine of FIG. 6, the routine of FIG. 7 will continue until the read error is resolved or an unrecoverable error is declared.

It will be understood that the foregoing description provides a new and useful approach to resolving the occurrence of one or more read errors in data recovered by the read channel 70. For purposes of the claims and consistent with the foregoing description, a corrective action will be readily understood to comprise an adjustment in the operational characteristics of the disc drive 10 which may be likely to improve the ability of the read channel 70 to eliminate the read error or errors. As corrective actions contemplated herein provide different levels of effectiveness depending upon what conditions have been experienced by the disc drive to cause the read error, the actual effectiveness of a corrective action will depend upon the particular factors contributing to the occurrence of the read error, which may not necessarily be known by the disc drive 10 at the time of the error. Thus, in any particular case, the corrective action may or may not actually improve the ability of the read channel 70 to resolve the error. Examples of corrective actions cited above include, but are not limited to track offsets, AGC holding, Viterbi threshold adjustment, filter performance adjustment, transversal equalizer tap weight and delay stage parameter adjustment and the like, each of which is well known in the art and can readily be implemented by one skilled in the art to practice the invention claimed herein.

Moreover, for the purposes of the claims and consistent with the foregoing description, erasures will be readily understood to comprise a set of symbols in the read channel suspected by components in the read channel 70 other than the ECC circuit 90 to contain erroneous content, based upon detection capabilities of the components in the read channel 70, said components providing erasure pointers which identify the suspected set of bits. Examples of preferred sources for such erasure pointers have been given above and include the threshold and preamp circuit 72 and the 8/9 decoder 88, although those skilled in the art will recognize that other components of the read channel 70 may be useful in providing erasure pointers, depending upon the construction of a particular read channel.

Finally, although in the preferred embodiments disclosed herein the channel quality indicators have been described as useful in improving the read error recovery operation of the disc drive 10, it is contemplated that the present invention could also be implemented during normal read channel operation. For example, monitoring the channel quality measurement and using this measurement in determining the appropriateness of ECC corrections would be useful during times of unstable operation of the disc drive 10, such as the failure to obtain or the loss and subsequent reacquisition of phase lock by the PLL.

Accordingly, as set forth above a channel quality measurement indicative of the error rate performance of the read channel 70 is obtained from a channel quality monitor 86. The channel quality measurement is then compared to a predetermined measurement threshold 110, 130. At such time that the channel quality measurement exceed the threshold, which indicates that the probability of outputting at least one data symbol with an undetected error is above a maximum acceptable level, error correction by an ECC circuit 90 is disallowed 118, 140. Alternatively, at such time that the channel quality measurement falls within the threshold, error correction by the ECC circuit 90 is allowed 112, 138.

As will be recognized, when the ECC circuit 90 is realized in hardware as prescribed above in the preferred embodiment, disallowance of the ECC correction generally comprises discarding the output from the ECC circuit 90 so that the output is not used by the host computer 50; however, when the ECC correction operation can be selectively disabled by, for example firmware, then disallowance can also comprise the disabling of the ECC correction operation. For purposes of clarity, the use of the term "circuitry" in the appended claims will be understood to cover both hardware and software/firmware implementations.

It will be clear that the present invention is well adapted to attain the ends and advantages mentioned as well as those inherent therein. While a presently preferred embodiment has been described for purposes of this disclosure, numerous changes may be made which will readily suggest themselves to those skilled in the art and which are encompassed in the spirit of the invention disclosed and as defined in the appended claims.

We claim:

1. In a disc drive of the type having a rotatable disc which stores user data on tracks of the disc in the form of magnetic flux transitions generated by a read/write head adjacent the disc, the read/write head outputting a read signal during a disc drive read operation, the read signal indicative of the magnetic flux transitions from the disc, the disc drive further having a read channel for receiving the read signal and reconstructing the user data in the form of data symbols and corresponding code symbols from the read signal, the code symbols used to detect errors in the data symbols by error detection and correction circuitry of the read channel, the error detection and correction circuitry characterized as capable of correcting up to a selected number of detected errors in the data symbols and providing an indication when the number of detected errors exceeds the selected number of detected errors correctable by the error detection and correction circuitry, a method for performing a read operation comprising steps of:

(a) determining a channel quality measurement indicative of error rate performance of the read channel, the channel quality measurement being determined from error values associated with the data symbols reconstructed by the read channel from the read signal;

(b) comparing the channel quality measurement to a predetermined measurement threshold, the predetermined measurement threshold selected to correspond to maximum acceptable probability of outputting at least one data symbol having an undetected error; and (c) selectively using code symbols to correct data errors in the data symbols during the read operation based upon whether the channel quality measurement exceeds the predetermined measurement threshold.

2. The method of claim 1, wherein step (c) comprises steps of:

(c)(i) disallowing code symbol based correction of data symbol errors employed by the error detection and correction circuitry when the channel quality measurement exceeds the predetermined measurement threshold; and (c)(ii) allowing code symbol based correction of data symbol errors employed by the error detection and correction circuitry when the channel quality measurement falls within the predetermined measurement threshold.

3. The method of claim 2, wherein step (c)(i) further comprises steps of:

(c)(i)(1) outputting the data symbols when no errors are detected in the data symbols; and (c)(i)(2) generating a signal indicative of the presence of an uncorrectable error in the data symbols when at least one error is detected in the data symbols.

4. The method of claim 2, wherein step (c)(ii) further comprises steps of:

(c)(ii)(1) detecting and correcting up to the selected number of errors capable of being corrected by the error detection and correction circuitry;

(c)(ii)(2) outputting the data symbols when no detected, uncorrected errors remain in the data symbols; and (c)(ii)(3) generating a signal indicative of the presence of an uncorrectable error in the data symbols when at least one error remains in the data symbols after the error detection and correction circuitry has operated to detect and correct errors in the data symbols.

5. The method of claim 1, wherein the read channel is further characterized as comprising an erasure pointer generator capable of generating an erasure pointer, the erasure pointer identifying a selected one of the data symbols as potentially including an error, each selected one of the data symbols identified by an erasure pointer comprising an erasure, and wherein the error detection and correction circuitry of the read channel further comprises the capability of correcting the errors associated with up to a selected number of distinct erasures, the method further comprises steps of:

(d) determining the number of distinct erasures identified by erasure pointers generated by the erasure pointer generator;

(e) comparing the number of distinct erasures to a predetermined erasure threshold, the predetermined erasure threshold selected to correspond to a number equal to or less than the selected number of distinct erasures that can be corrected by the error detection and correction circuitry; and (f) selectively using code symbols as a basis for correcting errors in data symbols during the read operation based upon whether the number of distinct erasures exceeds the predetermined erasure threshold.

6. The method of claim 5, wherein step (f) comprises steps of:

(f)(i) disallowing code symbol based correction of data symbol errors employed by the error detection and correction circuitry when the number of distinct erasures exceeds the predetermined erasure threshold; and (f)(ii) allowing code symbol based correction of data symbol errors employed by the error detection and correction circuitry when the number of distinct erasures falls within the predetermined erasure threshold.

7. The method of claim 6, wherein step (f)(i) further comprises steps of:

(f)(i)(1) outputting the data symbols when no errors are detected in the data symbols; and (f)(i)(2) generating a signal indicative of the presence of an uncorrectable error in the data symbols when at least one error is detected in the data symbols.

8. The method of claim 6, wherein step (f)(ii) further comprises steps of:

(f)(ii)(1) detecting and correcting data symbol errors based on respective code symbols for up to the selected number of errors capable of being corrected by the error detection and correction circuitry;

(f)(ii)(2) outputting the data symbols when no detected, uncorrected errors remain in the data symbols; and (f)(ii)(3) generating a signal indicative of the presence of an uncorrectable error in the data symbols when at least one error remains in the data symbols after the error detection and correction circuitry has operated to detect and correct errors in the data symbols.

9. The method of claim 5, wherein the read/write head comprises a magneto-resistive head, the erasure pointer generator comprises a threshold detector responsive to the read/write head and having a read signal level threshold, and wherein the threshold detector generates an erasure pointer in response to detection of a read signal having a signal level exceeding the read signal level threshold.

10. The method of claim 5, wherein the erasure pointer generator comprises an n/n+k decoder which decodes n+k bits written to the disc to n bits of data, and wherein the n/n+k decoder generates an erasure pointer in response to receipt of an illegal combination of n+k bits in the sequence of data symbols.

11. The method of claim 1 further comprising the initial steps of:

(d) selecting a corrective action to be performed by the disc drive in rereading a portion of a selected track associated with an uncorrected error, the corrective action comprising a selected change in operating characteristics of the read channel likely to improve the capability of the read channel to resolve the uncorrected error; and (e) rereading the portion of the selected track associated with the uncorrected error using the selected corrective action by generating a read signal from the portion of the selected track and generating a sequence of data symbols and associated code symbols from the read signal.

12. A disc drive comprising:

a disc having a plurality of tracks;

an actuator adjacent the disc, the actuator comprising a read/write head capable of writing data to the tracks and reading data from the tracks in the form of a read signal;

a read channel responsive to the read/write head, the read channel generating a sequence of data symbols and corresponding code symbols from the read signal, the read channel comprising:

error detection and correction circuitry for detecting and correcting up to a selected number of data symbol errors in the sequence of data symbols, wherein the error detection and correction circuitry replaces the data symbol errors within the sequence of data symbols with correct data symbols, the correct data symbols based on the corresponding code symbols of the sequence of data symbols; and a quality monitor selectively generating a channel quality measurement indicative of performance quality of the read channel, the channel quality measurement generated from error values associated with the sequence of data symbols and corresponding code symbols;

comparison means, responsive to the quality monitor, for comparing the channel quality measurement to a predetermined measurement threshold, the predetermined measurement threshold selected to correspond to a maximum acceptable probability of outputting at least one data symbol having an undetected error; and error correction control means, responsive to the comparison means, for controlling the correction of data symbol errors occurring within the sequence of data symbols, the correction based on the corresponding code symbols of the data symbols and in response to the comparison performed by the comparison means.

13. The disc drive of claim 12, wherein the error correction control means further comprises:

correction disallowing means for disallowing code symbol based correction of data symbol errors employed by the error detection and correction circuitry when the channel quality measurement exceeds the predetermined measurement threshold and declaring an uncorrectable error when the error detection and correction circuitry detects an error in the sequence of data symbols; and correction allowing means for allowing code symbol based correction of data symbol errors employed by the error detection and correction circuitry when the channel quality measurement falls within the predetermined measurement threshold and declaring an uncorrectable error when the error detection and correction circuitry detects a number of errors in the sequence of data symbols greater than the selected number of errors that the error detection and correction circuitry can correct; wherein the error correction control means allows the sequence of data symbols to be output by the read channel when the error detection and correction circuitry does not detect errors in the sequence of data symbols at such time that error correction is disallowed by the correction allowing means, and wherein the error correction control means allows the sequence of data symbols to be output by the read channel when the error detection and correction circuitry detects a number of errors in the sequence of data symbols that is equal to or less than the selected number of errors that the error detection and correction circuitry can correct at such time that error correction is allowed by the correction allowing means.

14. The disc drive of claim 13, further comprising:

an erasure pointer generator capable of generating an erasure pointer, the erasure pointer identifying a selected one of the data symbols in the sequence of data symbols as potentially including an error, each selected one of the data symbols identified by an erasure pointer comprising an erasure;

wherein the error detection and correction circuitry of the read channel further comprises the capability of correcting the errors associated with up to a selected number of distinct erasures; and wherein the disc drive further comprises:

erasure count comparison means, responsive to the erasure pointer generator, for comparing the number of distinct erasures identified by the erasure pointer generator to a predetermined erasure threshold, the predetermined erasure threshold selected to correspond to a number equal to or less than the selected number of distinct erasures that can be corrected by the error detection and correction circuitry; and wherein the correction disallowing means further disallows code symbol based correction of data symbol errors employed by the error detection and correction circuitry when the number of distinct erasures identified by the erasure pointer generator exceeds the predetermined erasure threshold.

15. The disc drive of claim 14 wherein the read/write head comprises a magneto-resistive head, the erasure pointer generator comprises a threshold detector responsive to the read/write head and having a read signal level threshold, and wherein the threshold detector generates an erasure pointer in response to detection of a read signal having a signal level exceeding the read signal level threshold.

16. The disc drive of claim 14 wherein the erasure pointer generator comprises an n/n+k decoder which decodes n+k bits written to the disc to n bits of data, and wherein the n/n+k decoder generates an erasure pointer in response to receipt of an illegal combination of n+k bits in the sequence of data symbols.

\* \* \* \* \*

UNITED STATES PATENT AND TRADEMARK OFFICE
CERTIFICATE OF CORRECTION

PATENT NO.    : 6,043,946
DATED         : March 28, 2000
INVENTOR(S)   : Stephen R. Genheimer and Jimmie R. Shaver It is certified that error appears in the above-identified patent and that said Letters Patent is hereby corrected as shown below:

Column 6,
Line 44, replace "for die subsequent" with -- for the subsequent --.

Column 9,
Lines 58 and 59, replace "at such tinge" with -- at such time --.

Column 12,
Line 6, replace "can be nesU corrected" with -- can be corrected --.
Lines 38 and 39, replace "first C; corrective action" with -- first corrective action --.

Column 14,
Lines 55 and 56, replace "to maximum" with -- to a maximum --.

Signed and Sealed this

Second Day of April, 2002

Attest:

*Attesting Officer*

JAMES E. ROGAN
*Director of the United States Patent and Trademark Office*